US007227752B2

(12) United States Patent
Xia et al.

(10) Patent No.: US 7,227,752 B2
(45) Date of Patent: Jun. 5, 2007

(54) HEAT DISSIPATION DEVICE

(75) Inventors: Wan-Lin Xia, Shenzhen (CN); Bo-Yong Yang, Shenzhen (CN); Tao Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Chen, Taipei Hsien (TW)

( * ) Notice: Subject to any disclaimer, the term of this patent is extended or adjusted under 35 U.S.C. 154(b) by 141 days.

(21) Appl. No.: 11/135,569

(22) Filed: May 23, 2005

(65) Prior Publication Data

US 2006/0262504 A1 Nov. 23, 2006

(51) Int. Cl.
*H05K 7/20* (2006.01)
(52) U.S. Cl. .............. 361/700; 361/699; 361/703; 361/709; 257/715; 257/722; 165/80.3; 165/104.33; 165/185
(58) Field of Classification Search ........... 361/689, 361/698, 699, 700–703; 165/80.3, 80.4, 165/104.21, 104.26, 104.33; 174/15.2; 257/714, 257/715
See application file for complete search history.

(56) References Cited

U.S. PATENT DOCUMENTS 1,902,350 A * 3/1933 Whitaker ............... 165/79
6,006,827 A * 12/1999 Lu ........................ 165/182
6,785,140 B2 * 8/2004 Artman et al. ........... 361/709
6,894,900 B2 * 5/2005 Malone ................... 361/700
2004/0035558 A1 2/2004 Todd et al.
2004/0050535 A1 3/2004 Malone et al.

FOREIGN PATENT DOCUMENTS

| JP | 401264297 A | * | 10/1989 |
| JP | 404079299 A | * | 3/1992 |
| TW | M240782 | | 8/2004 |
| TW | M245465 | | 10/2004 |

* cited by examiner

*Primary Examiner*—Michael Datskovskiy
(74) *Attorney, Agent, or Firm*—Morris Manning & Martin LLP; Tim Tingkang Xia, Esq.

(57) ABSTRACT

A heat dissipation device includes a base, at least one heat pipe having an evaporating section and a condensing section, at least one reinforcing member without phase-change therein, and a plurality of fins. The evaporating section of the heat pipe contacts the base. The condensing section of the heat pipe departs from the base. The fins are stacked on the heat pipe and the reinforcing member. Therefore, the heat dissipation device has steady configuration and low cost.

15 Claims, 3 Drawing Sheets

HEAT DISSIPATION DEVICE

BACKGROUND

1. Field

The present invention relates generally to heat dissipation devices, and more particularly to a heat dissipation device used for electronic devices.

2. Prior Art

It is well known that electronic devices generating large amounts of heat during their normal operation. The heat must be quickly removed to prevent the electronic devices from becoming overheated or damaged due to heat. Typically, a heat dissipation device is attached to an electronic device to facilitate removal of the heat therefrom.

Nowadays, numerous heat dissipation devices are used to dissipate heat generated by electronic devices. Among those, a type of heat dissipation device comprising heat pipes is applied widely. Here, the heat pipe utilizes working fluid absorbing or generating heat by phase change between gas and liquid to transfer heat generated by the electronic device rapidly. Generally, the heat pipe is a vacuum sealed pipe that is filled with a heat transfer working liquid, which has low boil temperature and steady chemical qualities, such as water, alcohol, acetone and so on. The heat pipe has an evaporating section thereof close to the heat generating electronic device, and a condensing section thereof remote from the electronic device. As the electronic device works and heats up, the working liquid of evaporating section absorbs heat and evaporates into vapor. The vapor reaches the condensing section, where the vapor exhausts heat, then condenses and refluxes to the evaporating section. At most cases, the heat pipe is used with a heat sink. The evaporating section of the heat pipe contacts a base of the heat sink. The condensing section projects beyond the base and stacks with a plurality of fins. The heat generated by the electronic device is transferred from the base to the fins via the heat pipe rapidly, and then is dissipated by the fins. So, the heat dissipation device with heat pipes having rapid heat transfer is very different from a conventional heat sink with limited heat transfer relying on metals.

Generally, at a condition of meeting with the heat dissipating demand, an amount of the heat pipe of the heat dissipation device is as few as possible, maybe, it can be one or two, to lower a cost of the heat dissipation device. However, at this case, the stacked fins are supported by the heat pipes, which forms one or two supporting points for the fins, such that, the fins can not be stacked on the heat pipe steadily. As a result, a configuration of the heat dissipation device can not be steady correspondingly.

SUMMARY

Accordingly, what is needed is to provide a heat dissipation device has steady configuration and low cost.

A heat dissipation device of a preferred embodiment of the invention comprises a base, at least one heat pipe having an evaporating section and a condensing section, at least one reinforcing member without phase-change therein, and a plurality of fins. The evaporating section of the heat pipe contacts the base. The condensing section of the heat pipe departs from the base. The fins are stacked on the heat pipe and the reinforcing member. Therefore, the heat dissipation device has steady configuration and low cost.

Other advantages and novel features of the invention will become more apparent from the following detailed description when taken in conjunction with the accompanying drawings, in which:

DETAILED DESCRIPTION OF THE EMBODIMENTS

Figure 1:
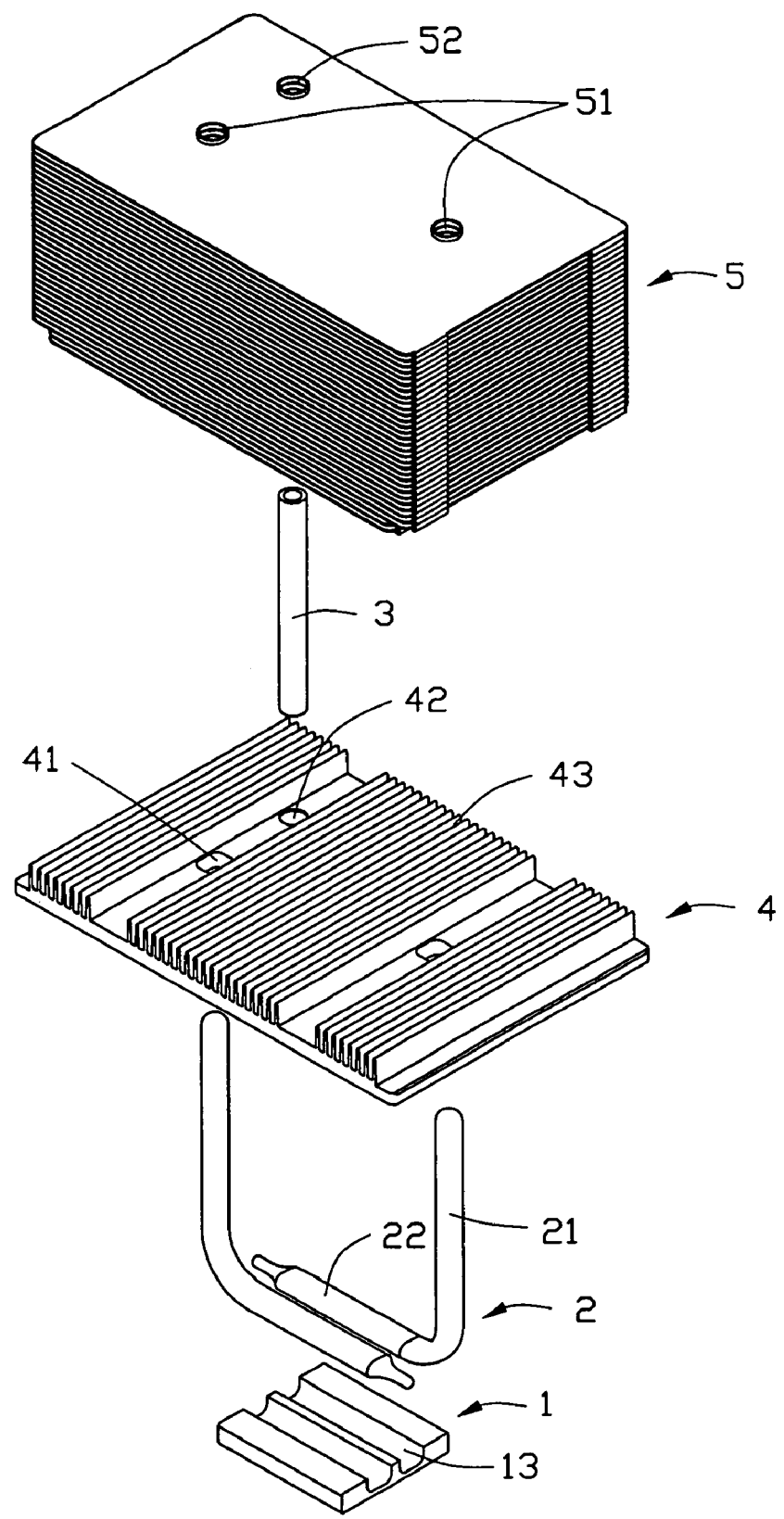
FIG. 1 is an exploded view of a heat dissipation device according to a preferred embodiment of the present invention.
Figure 2:
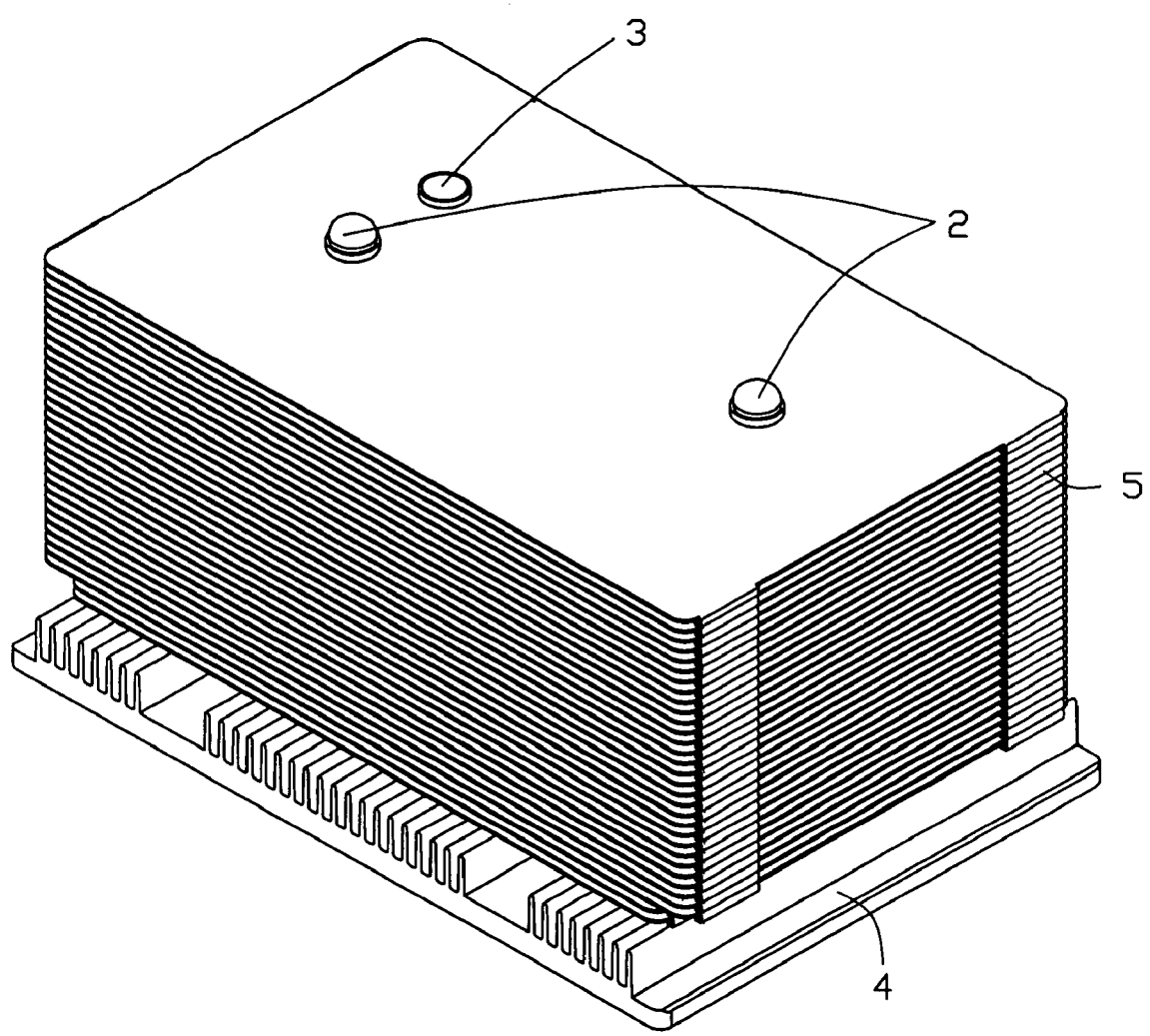
FIG. 2 is an assembly view of FIG. 1.

Referring to FIGS. 1-2, the heat dissipation device of a preferred embodiment of the invention is shown to dissipate heat of an electronic component like a central processing unit (CPU). The heat dissipation device comprises a base 1, two heat pipes 2, a reinforcing member 3, a plate 4 and a plurality of fins 5. The base 1 contacts the heat pipes 2. The fins 5 are staked on the heat pipes 2 and the reinforcing member 3.

Each heat pipe 2 is "L" shaped and comprises a condensing section 21 and an evaporating section 22.

The base 1 defines a pair of grooves 13 in an upper surface thereof, for receiving the evaporating sections 22 of the heat pipes 2 therein respectively.

The reinforcing member 3 is a rigid member without phase-change therein. It can be a hollow tube or a solid column, such as an aluminum tube or an aluminum column or other things like this.

The plate 4 may be rectangular, defines two through holes 41 therein for engaging with the heat pipes 2 respectively, and a recess 42 on an upper surface thereof for engaging with the reinforcing member 3. The holes 41 and the recess 42 are distributed misaligned on the upper surface of the plate 4, i.e., the two holes 41 and the recess 42 define a trigonal configuration on the upper surface of the plate 4. Pluralities of fins 43 are formed on the upper surface of the plate 4 integratively.

Each fin 5 defines through apertures 51,52 therein, for engaging with the heat pipes 2 and the reinforcing member 3 respectively.

The evaporating sections 22 of the heat pipes 2 are engaged respectively in the grooves 13 of the base 1 by felted or welded or interferentially coupled or other means. The plate 4 is above the base 1. The condensing sections 21 of the heat pipes 2 respectively pass through the holes 41 of the plate 4 and project beyond the plate 4. The reinforcing member 3 is fixed on the plate 4 via a one end thereof being felted or welded or interferentially coupled in the recess 42 of the plate 4. The fins 5 are stacked on the heat pipes 2 and the reinforcing member 3, with the condensing sections 21 of the heat pipes 2 and an opposite end of the reinforcing member 3 being received respectively in the apertures 51,52 of the fins 5.

It can be understood, the two L-shaped heat pipes 2 can be replaced by an U-shaped heat pipe with two condensing sections and an evaporating section connecting with the condensing sections. Correspondingly, the base 1 defines one groove matching with the evaporating section. It also can be understood, the heat dissipation device has one heat pipe and two or more reinforcing members 3.

According to the above embodiment of the invention, the reinforcing member 3 and the heat pipe 2 are so distributed that supporting points to the stacked fins 5 are formed misaligned. Consequently, the fins 5 are stacked above the base 1 steadily. And thus, the configuration of the heat dissipation device is steady. Additionally, at a condition of meeting with a demand of the heat dissipation for the electronic device, due to the adoption of the reinforcing member 3, the heat dissipation device can decrease an amount of the heat pipes 2. Therefore, a cost of the heat dissipation device is lowered.

Figure 3:
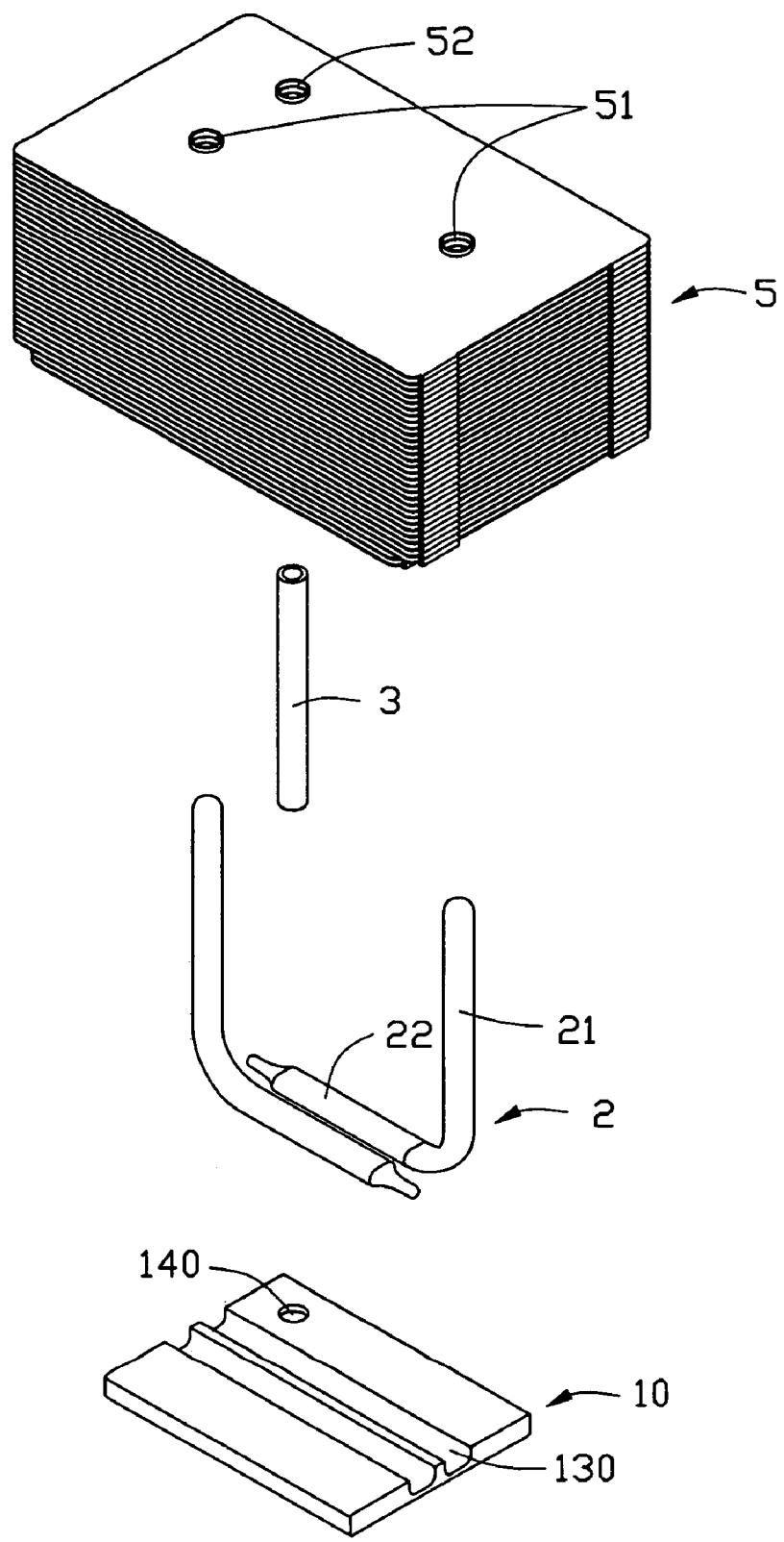
FIG. 3 is an exploded view of a heat dissipation device according to an alternative embodiment of the present invention.

Referring to FIG. 3, a heat dissipation device of an alternative embodiment of the invention is illustrated. The heat dissipation device is substantially similar to the heat dissipation device of the preferred embodiment. However, what is different is that the heat dissipation device omits the plate 4 of the preferred embodiment, a base 10 defines a pair of grooves 130 for receiving the evaporating sections 22 of the heat pipes 2, and a recess 140 in an upper surface thereof. The reinforcing member 3 is fixed on the base 10 via the end thereof matching with the recess 140 of the base 10.

It is to be understood, however, that even though numerous characteristics and advantages of the present invention have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A heat dissipation device comprising:
   a base;
   at least one heat pipe comprising an evaporating section contacting the base, and a condensing section departing from the base;
   at least one reinforcing member without phase-change therein; and
   a plurality of fins stacked on the at least one heat pipe and the at least one reinforcing member;
   wherein the heat dissipation device further comprises a plate disposed between the base and the fins.

2. The heat dissipation device of claim 1, wherein the at least one heat pipe and the at least one reinforcing member are disposed to form at least three misaligned supporting points to the fins.

3. The heat dissipation device of claim 1, wherein each fin defines at least one through aperture therein, receiving the at least one reinforcing member therein.

4. The heat dissipation device of claim 1, wherein the plate forms a plurality of fins thereon.

5. The heat dissipation device of claim 1, wherein the at least one reinforcing member is engaged with the plate at an end thereof.

6. The heat dissipation device of claim 5, wherein the plate defines at least one recess in an upper surface thereof, receiving the end of the at least one reinforcing member therein.

7. The heat dissipation device of claim 1, wherein the reinforcing member is engaged with the base at an end thereof.

8. The heat dissipation device of claim 7, wherein the base defines at least one recess in an upper surface thereof, receiving the end of the at least one reinforcing member therein.

9. The heat dissipation device of claim 1, wherein the at least one reinforcing member is a rigid member.

10. The heat dissipation device of claim 9, wherein the at least one reinforcing member is a hollow metal column.

11. The heat dissipation device of claim 10, wherein a material of the at least one reinforcing member is aluminum.

12. The heat dissipation device of claim 9, wherein the at least one reinforcing member is a solid metal column.

13. The heat dissipation device of claim 12, wherein a material of the at least one reinforcing member is aluminum.

14. A heat dissipation device comprising:
   a base;
   at least one heat pipe comprising an evaporating section contacting the base and a condensing section;
   at least one reinforcing member without phase-change therein; and
   a plurality of fins stacked on the condensing section of the at least one heat pipe and the at least one reinforcing member;
   wherein the condensing section of the at least one heat pipe and the at least one reinforcing member are disposed to form at least three misaligned supporting points to the fins; and
   wherein the heat dissipation device further comprises a plate disposed between the base and the fins.

15. A heat dissipation device for dissipating heat of an electronic component, comprising:
   a base arranged to thermally contact with said electronic component and gain said heat therefrom;
   at least one heat pipe arranged next to said base and thermally contacting with said base to gain said heat therefrom;
   a plurality of fins arranged next to said at least one heat pipe and thermally contactable with said at least one heat pipe so as to gain said heat therefrom for dissipating said heat out of said heat dissipating device; and
   at least one reinforcing member disposed between said base and said plurality of fins, and providing non-thermal engagement between said base and said plurality of fins to support said plurality of fins in position relative to said base;
   wherein a plate is disposed between said base and said plurality of fins, and used to perform said non-thermal engagement of said at least one reinforcing member and said base.

* * * * *